United States Patent
Miller et al.

(10) Patent No.: US 8,760,157 B2
(45) Date of Patent: Jun. 24, 2014

(54) MULTIFERROIC ANTENNA/SENSOR

(75) Inventors: Robert J. Miller, Fall City, WA (US);
William P. Geren, Shoreline, WA (US);
Stephen P. Hubbell, Gig Harbor, WA (US)

(73) Assignee: The Boeing Company, Chicago, IL (US)

( * ) Notice: Subject to any disclaimer, the term of this patent is extended or adjusted under 35 U.S.C. 154(b) by 622 days.

(21) Appl. No.: 12/561,498

(22) Filed: Sep. 17, 2009

(65) Prior Publication Data
US 2011/0062955 A1 Mar. 17, 2011

(51) Int. Cl.
*G01R 33/02* (2006.01)
(52) U.S. Cl.
USPC .......... 324/249; 455/41.1; 324/244; 324/252; 310/311
(58) Field of Classification Search
USPC ........... 324/249, 244, 252; 455/41.1; 310/311
See application file for complete search history.

(56) References Cited

U.S. PATENT DOCUMENTS

| | | | |
|---|---|---|---|
| 5,675,252 A | 10/1997 | Podney | |
| 5,694,134 A | 12/1997 | Barnes | |
| 5,994,891 A | 11/1999 | Hubbell | |
| 6,184,841 B1 * | 2/2001 | Shober et al. | 343/853 |
| 6,297,579 B1 | 10/2001 | Martin | |
| 6,313,627 B1 * | 11/2001 | Van Den Berg | 324/252 |
| 6,362,617 B1 | 3/2002 | Hubbell | |
| 7,023,206 B2 * | 4/2006 | Viehland et al. | 324/249 |
| 7,514,804 B2 * | 4/2009 | Wang | 290/1 R |
| 7,952,349 B2 * | 5/2011 | Huang et al. | 324/249 |
| 8,248,272 B2 * | 8/2012 | Arnold et al. | 340/936 |
| 2006/0152227 A1 * | 7/2006 | Hammer | 324/634 |
| 2006/0279171 A1 | 12/2006 | Viehland et al. | |
| 2007/0252593 A1 | 11/2007 | Takeuchi et al. | |
| 2008/0012558 A1 * | 1/2008 | Rossler et al. | 324/252 |
| 2008/0084205 A1 * | 4/2008 | Zimmer | 324/252 |
| 2009/0001980 A1 * | 1/2009 | Geren et al. | 324/252 |
| 2009/0085695 A1 * | 4/2009 | Srinivasan | 333/219.2 |
| 2009/0243607 A1 * | 10/2009 | Mather et al. | 324/249 |
| 2009/0284254 A1 * | 11/2009 | Kasajima | 324/207.21 |
| 2010/0015918 A1 | 1/2010 | Liu et al. | |
| 2010/0180687 A1 * | 7/2010 | Hammerschmidt | 73/718 |

OTHER PUBLICATIONS

Dong, Shuxiang et al. "A strong magnetoelectric voltage gain effect in magnetostrictive-piezoelectric composite." Applied Physics Letters, Oct. 18, 2004, vol. 85, No. 16, pp. 3534-3536.
Dong, Shuxiang et al. "Enhanced magnetoelectric effects in laminate composites of Terfenol-D/Pb(Zr,Ti)O3 under resonant drive." Applied Physics Letters, Dec. 8, 2003, vol. 83, No. 23, pp. 4812-4814.

(Continued)

*Primary Examiner* — Huy Q Phan
*Assistant Examiner* — Temilade S Rhodes-Vivour
(74) *Attorney, Agent, or Firm* — Charles L. Moore; Moore & Van Allen PLLC

(57) ABSTRACT

A multiferroic antenna and sensor where the sensor includes a multiferroic stack of multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal. An output of the multiferroic stack comprises the electrical voltage amplified proportional to a total number of multiple connected multiferroic layer-pairs in the multiferroic stack.

19 Claims, 6 Drawing Sheets

(56) References Cited

OTHER PUBLICATIONS

Dong, Shuxiang et al. "Magnetoelectric effect in Terfenol-D/ Pb(Zr,TiO)3/μ-metal laminate composites." Applied Physics Letters, 2006, vol. 89, pp. 122903-1-122903-3.

Dong, Shuxiang et al. "Near-ideal magnetoelectricity in high-permeability magnetostrictive/piezofiber laminates with a (2-1) connectivity." Applied Physics Letters, 2006, vol. 89, 252904-1-252904-3.

Lou, J. et al. "Giant microwave tunability in FeGaB/lead magnesium niobate-lead titanate multiferroic composites." Applied Physics Letters, 2008, vol. 92, 262502-1-262502-3.

Vopsaroiu, Marian et al. "Mutliferroic magnetic recording read head technology for 1 Tbit/in.2 and beyond." Journal of Applied Physics, 2008, vol. 103, 07F506-1-07F506-3.

Zhai, Junyi et al. "Detection of pico-Tesla magnetic fields using magneto-electric sensors at room temperature." Applied Physics Letters, 2006, vol. 88, 062510-1-062510-3.

Zhai, Junyi et al. "Giant magnetoelectric effect in Metglas/ polyvinylidene-fluoride laminates." Applied Physics Letters, 2006, vol. 89, 083507-1-083507-3.

Dapino, Smith, Calkins, Flatau, "A Magnetoelastic Model for Villari-Effect Magnetostrictive Sensors", 2002, North Carolina State University Center for Research in Scientific Computation, pp. 1-17.

Untited States Patent and Trademark Office, U.S. Appl. No. 12/885,817 Non-Final Office Action dated Feb. 15, 2013, pp. 1-30.

UK Intellectual Property Office, Combined Search and Examination Report under Sections 17 and 18(3) for GB Application No. GB10115436.7 dated Jan. 17, 2011.

\* cited by examiner

MULTIFERROIC ANTENNA/SENSOR

BACKGROUND

The present disclosure is related to antennas, and more specifically to a multiferroic antenna/sensor.

Conventional antennas, such as dipoles, slots and patches, that receive an electric field or magnetic field of an incident signal and convert it to an output signal must either protrude from the surface to which they are mounted or require a cavity in the surface behind them. Protruding antennas on aircraft increase drag and present anti-icing and other challenges. Antenna cavities on aircraft also add weight (reducing aircraft range/payloads), take up valuable space, result in holes through structural skins of the aircraft that are subject to lightning and fluid penetration, and are costly to integrate into the structure of the aircraft.

Radio frequency (RF) sensors that respond directly to the magnitude of an incident magnetic field, rather than its time derivative, do not have to protrude through the surface nor require a cavity because the magnetic field is not shorted out by proximity to a ground plane and is in fact a maximum at that location. This class of sensors includes super conducting quantum interference devices (SQUID) and giant magneto resistance (GMR) devices. However, antennas based on SQUID devices must be cooled to temperatures close to absolute zero resulting in increased costs, weight, and complexity for flight operations. Further, antennas that use GMR devices are extremely inefficient and have not been proven and require a direct current (DC) bias current.

SUMMARY

According to one aspect of the present disclosure, a multiferroic sensor includes a multiferroic stack of multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal, wherein an output of the multiferroic stack comprises the electrical voltage amplified proportional to a total number of multiple connected multiferroic layer-pairs in the multiferroic stack.

According to another aspect of the present disclosure, an aircraft includes a skin and an antenna including a multiferroic sensor, the multiferroic sensor comprising a multiferroic stack residing on an outside of the skin, the multiferroic stack comprising multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal, wherein an output of the multiferroic sensor comprises the electrical voltage amplified proportional to a total number of multiple connected multiferroic layer-pairs in the multiferroic stack.

According to a still further aspect of the present disclosure, an antenna includes a multiferroic sensor, the multiferroic sensor comprising a multiferroic stack residing on an outside of the skin, the multiferroic stack comprising multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal, an output of the multiferroic sensor comprising the electrical voltage amplified proportional to a total number of multiple connected multiferroic layer-pairs in the multiferroic stack; a receiver, the receiver amplifying and processing the multiferroic sensor output; and a matching circuit connected between the multiferroic sensor and the receiver, the matching circuit matching an impedance of the multiferroic sensor to an impedance of the receiver.

The features, functions, and advantages that have been discussed can be achieved independently in various embodiments of the present disclosure or may be combined in yet other embodiments further details of which can be seen with reference to the following description and drawings.

BRIEF DESCRIPTION OF THE DRAWINGS

The present disclosure is further described in the detailed description which follows in reference to the noted plurality of drawings by way of non-limiting examples of embodiments of the present disclosure in which like reference numerals represent similar parts throughout the several views of the drawings and wherein.

DETAILED DESCRIPTION

Figure 1:
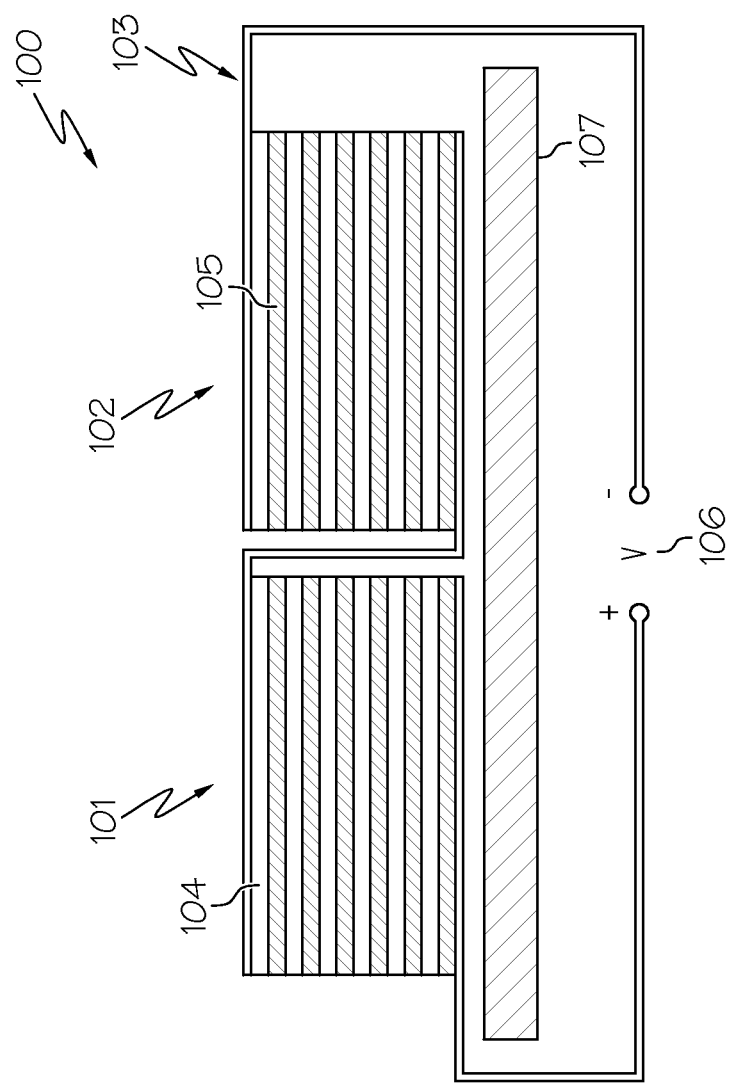
FIG. 1 is a diagram of a multiferroic sensor according to an exemplary embodiment of the present disclosure.

The following detailed description of embodiments refers to the accompanying drawings, which illustrate specific embodiments of the disclosure. Other embodiments having different structures and operation do not depart from the scope of the present disclosure.

Embodiments according to the present disclosure provide a multiferroic sensor that may be part of an antenna and that may include multiferroic layered-pairs arranged in multi-layered stacks and arrays of stacks. The multiferroic layered-pairs may include alternating layers of magnetostrictive material and piezoelectric material that are bonded together. The magnetic field of an incident signal on the multiferroic layered-pairs causes a mechanical strain in the magnetostrictive layers which in turn strains the adjacent piezoelectric layers thereby producing an electric voltage that is proportional to the magnitude of incident signal. This voltage is the multiferroic sensor output and may be fed to other antenna electronics for amplification and processing.

According to embodiments of the present disclosure the magnetostrictive layers may be any magnetostrictive material such as, for example, Terfenol, nickel, etc. The magnetostrictive layers may or may not be magnetically biased to improve sensitivity to the incoming signal. The thickness of the magnetostrictive layers may be significantly less than one electrical skin depth so that an incident magnetic field does not diminish in the interior of the magnetostrictive layer resulting in reduced strain and reduced sensor output. The outermost magnetostrictive layer in a stack may be used to electrically connect the voltage generated by the piezoelectric layers to antenna electronics.

Moreover, according to embodiments of the present disclosure, the piezoelectric layers may be polarized in a direction perpendicular to the antenna ground plane so that the voltage generated by the incident signal is not shorted out by a proximity to the ground plane. Moreover, the piezoelectric layers may have a built-in strain (i.e., bias strain) in order to enhance the sensitivity to strain and thus enhance the voltage generated. The piezoelectric layers may be any piezoelectric material such as, for example, lead zirconium titrate (PZT), lead-magnesium-niobium-Ti—O (PMN-PT), etc. The thickness of the piezoelectric layers is small enough that stress exerted by the adjacent magnetostrictive layers results in strain in the piezoelectric layers that does not diminish in the interior of the piezoelectric layer due to excessive thickness. An optimum thickness ratio of magnetostrictive to piezoelectric layers may depend on the relative mechanical modulii of the layers but may be, for example, typically about ½. The length and width of the stacks of layer-pairs is small enough to allow the incident signal's magnetic field to penetrate to the interior of the stack from the sides. Further, the length and width of the stack is small enough so that a mechanical resonance (caused by the alternating magnetic-field-induced stresses in the stack) is at a frequency higher than the intended antenna operating frequency band (linear operation) or is at the intended operational frequency of the antenna (resonant narrowband operation). These parameters lead to stack lengths and widths that are very small, for example, as small as 10 microns for 18 GHz antennas.

According to embodiments of the present disclosure, an output voltage from the multiferroic sensor of the antenna may be proportional to the height of the stack. Output voltage may be increased by having many (possibly hundreds) of layer-pairs in a stack and alternately by connecting two or more stacks in series. The amount of current that an array of multiferroic stacks may deliver as output from the multiferroic sensor to an antenna amplifier circuit may be proportional to the number of stacks connected in parallel in the multiferroic sensor. According to embodiments of the present disclosure, a multiferroic sensor may also include one or more arrays of many stacks connected in series and/or in parallel to optimize the antenna functionality. In addition, a multiferroic antenna according to embodiments of the present disclosure may include a multiferroic sensor as well as circuitry to match the impedance of the multiferroic sensor to receiver electronics of the antenna and/or electronics to amplify and process the output voltage of the multiferroic sensor.

Moreover, according to embodiments of the present disclosure, the shape of a multiferroic array may be any shape and may be optimized for minimum cost and minimum interference with other systems (e.g., aircraft systems). The array of multiferroic stacks may include dielectric material in a protective cover. Further, dielectric material may also fill gaps that reside between the multiferroic stacks. The protective material preferably may have a modulus much lower than the multiferroic elements to prevent loss of antenna sensitivity. The array of multiferroic stacks may be in the form of an appliqué that is lightweight and is easily replaceable.

In addition, according to embodiments of the present disclosure, a multiferroic antenna/sensor, when operating below resonance, may have an output voltage that is linearly proportional to the amplitude of an incident signal over nine orders of magnitude, i.e., far more than any existing magnetic sensors. An antenna/sensor according to embodiments of the present disclosure does not require cooling nor does it require any direct current (DC) bias current.

Embodiments according to the present disclosure may include multiple multiferroic layers, each layer consisting of a thin layer of magnetostrictive material in close contact with a piezoelectric material stacked in the vertical direction, so that the voltages of all layers are combined in series (i.e., summed) to provide a more useful (larger) output signal. The thickness of a single magnetostrictive layer may be restricted to be small compared to a skin depth in the material to insure good coupling to the incident RF field. As noted previously, the output voltage from stacks of multiferroic layers may be further increased by placing the stacks in an array and connecting multiple stacks together in a series. An impedance of a multiferroic sensor (i.e., one or more multiferroic stacks) may be matched to an impedance of a receiver of the antenna (or other conventional 50 ohm antenna electronics). This may be implemented with, for example, a unity gain field effect transistor (FET) or any other method.

FIG. 1 shows a diagram of a multiferroic sensor according to an exemplary embodiment of the present disclosure. The multiferroic sensor 100 may include two multiferroic stacks 101, 102. Each multiferroic stack 101, 102, may include alternating layers of magnetostrictive material 104 and piezoelectric material 105. In this exemplary embodiment, two multiferroic stacks 101, 102, are shown, however, embodiments according to the present disclosure are not limited to two multiferroic stacks and may include one or more than two multiferroic stacks. Further, the multiferroic stacks 101, 102, in this example embodiment, are connected together in series by an interconnect material 103 that may be a wire, or any other conductive material. The interconnect material 103 may provide a connection from a first end of the first multiferroic stack 101 to a first end of the second multiferroic stack 102. Further, a portion of the interconnect material 103 may connect a second end of the first multiferroic stack 101 to one multiferroic sensor output and another portion of the interconnect material 103 may connect a second end of the second multiferroic stack 102 to a second multiferroic sensor output. The two multiferroic stacks 101, 102 with the interconnect material 103 may be isolated from electrical connects for the output voltage 106 by a thin electrically insulating layer 107 between the two multiferroic stacks 101, 102 and the electrical connects producing the output voltage 106.

Each multiferroic stack 101, 102, may include multiple stacked multiferroic layers-pairs where each multiferroic layer-pair consists of an alternating layer of the magnetostrictive material 104 and a piezoelectric material 105 bonded together enabling a high signal sensitivity. A magnetic field of an incident signal on each multiferroic layer-pair of magnetostrictive material 104 and piezoelectric material 105 causes mechanical strain in the magnetostrictive material 104 layers that strain adjacent piezoelectric material layers 105 producing an electrical voltage from each multiferroic layer-pair proportional to the magnitude of the incident signal. A built-in mechanical polarization (i.e., a bias strain) yields increased sensitivity to an incident signal's magnetic field. A sum of the voltages from all multiferroic layer-pairs is the multiferroic sensor output voltage 106. Therefore, the multiferroic sensor output voltage 106 consists of the electrical voltage from each multiferroic layer-pair amplified proportional to a total number of multiple connected multiferroic layered-pairs in the multiferroic stacks 101, 102. In this exemplary embodiment of the present disclosure, with the two multiferroic stacks 101, 102 connected in series, an output voltage from each stack is added together to produce the total output voltage 106 from the multiferroic sensor 100.

Figure 2:
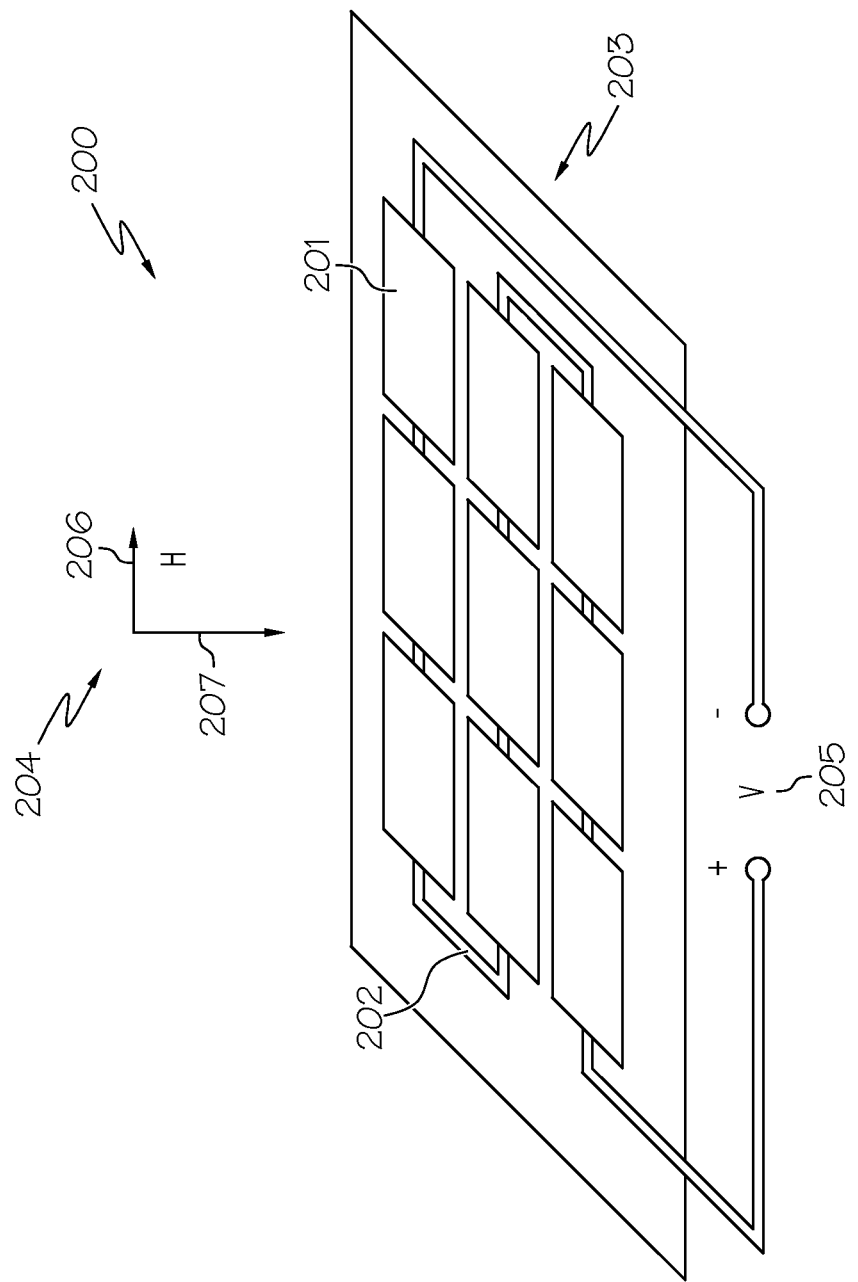
FIG. 2 is a diagram of a multiferroic sensor according to another exemplary embodiment of the present disclosure.

FIG. 2 shows a diagram of a multiferroic sensor according to another exemplary embodiment of the present disclosure. In this exemplary embodiment, a multiferroic sensor 200 includes a 9 element array of multiferroic stacks separated by gaps and mounted very close (e.g., microns) to a ground plane 203. Each multiferroic stack 201 may include multiple connected multiferroic layer-pairs each including an alternating layer of magnetostrictive material and piezoelectric material bonded together. As noted previously, a magnetic field of an incident signal 204 causes mechanical strain in the magnetostrictive material layers that strain adjacent piezoelectric material layers producing an electrical voltage in each multiferroic layer-pair proportional to the incident signal 204. An output voltage from each multiferroic stack 201 may be proportional to a total number of multiple connected multiferroic layer-pairs in the multiferroic stack 201.

In this exemplary embodiment, the array of multiferroic stacks 201 are connected by an interconnect material 202 in a serial fashion. In this regard, an output voltage 205 from the multiferroic sensor 200 may be a sum of the output voltages from each of the individual multiferroic stacks 201. Embodiments of the present disclosure are not limited to the array of multiferroic stacks 201 being connected in series but may also include an array of multiferroic stacks connected in parallel or an array of multiferroic stacks connected in a combination of series and parallel connections. As the number of multiferroic stacks 201 connected in series increases, a sensor output voltage increases proportionately to the number of multiferroic stacks. Further, as the number of multiferroic stacks 201 connected in parallel increases, a sensor output current increases proportionately to the number of multiferroic stacks. The multiferroic sensor 200 may be attached to an outer surface of a structure, vehicle, aircraft, etc. and mounted very close (e.g., microns) to the ground plane 203. A thin insulating layer (not shown) may be placed between the ground plane 203 and connectors providing the output voltage 205 from the multiferroic sensor 200 to prevent them from shorting out. The incident signal 204 may have a magnetic field component 206 and be traveling in a direction 207 towards the multiferroic sensor 200. The incident signal 204 may also have an electrical field that extends in a direction perpendicular to the magnetic field 206 (e.g., in a direction out of the paper).

Figure 3:
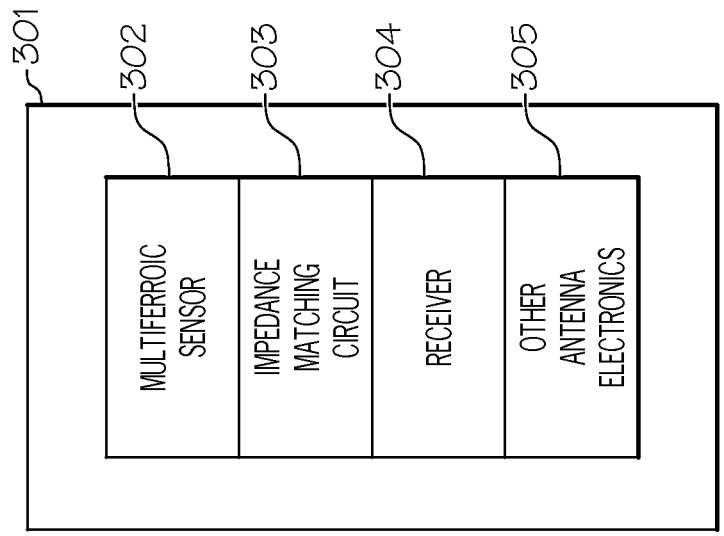
FIG. 3 is a block diagram of a multiferroic antenna according to an exemplary embodiment of the present disclosure.

FIG. 3 shows a block diagram of a multiferroic antenna according to an exemplary embodiment of the present disclosure. The antenna 301 may include several components such as, for example, a multiferroic sensor 302, an impedance matching circuit 303, a receiver section 304 and any other antenna electronics 305. The antenna matching circuit 303 may reside between the multiferroic sensor 302 and receiver electronics 304 of the antenna 301 to match the impedance between the multiferroic sensor 302 and the receiver 304.

Figure 4:
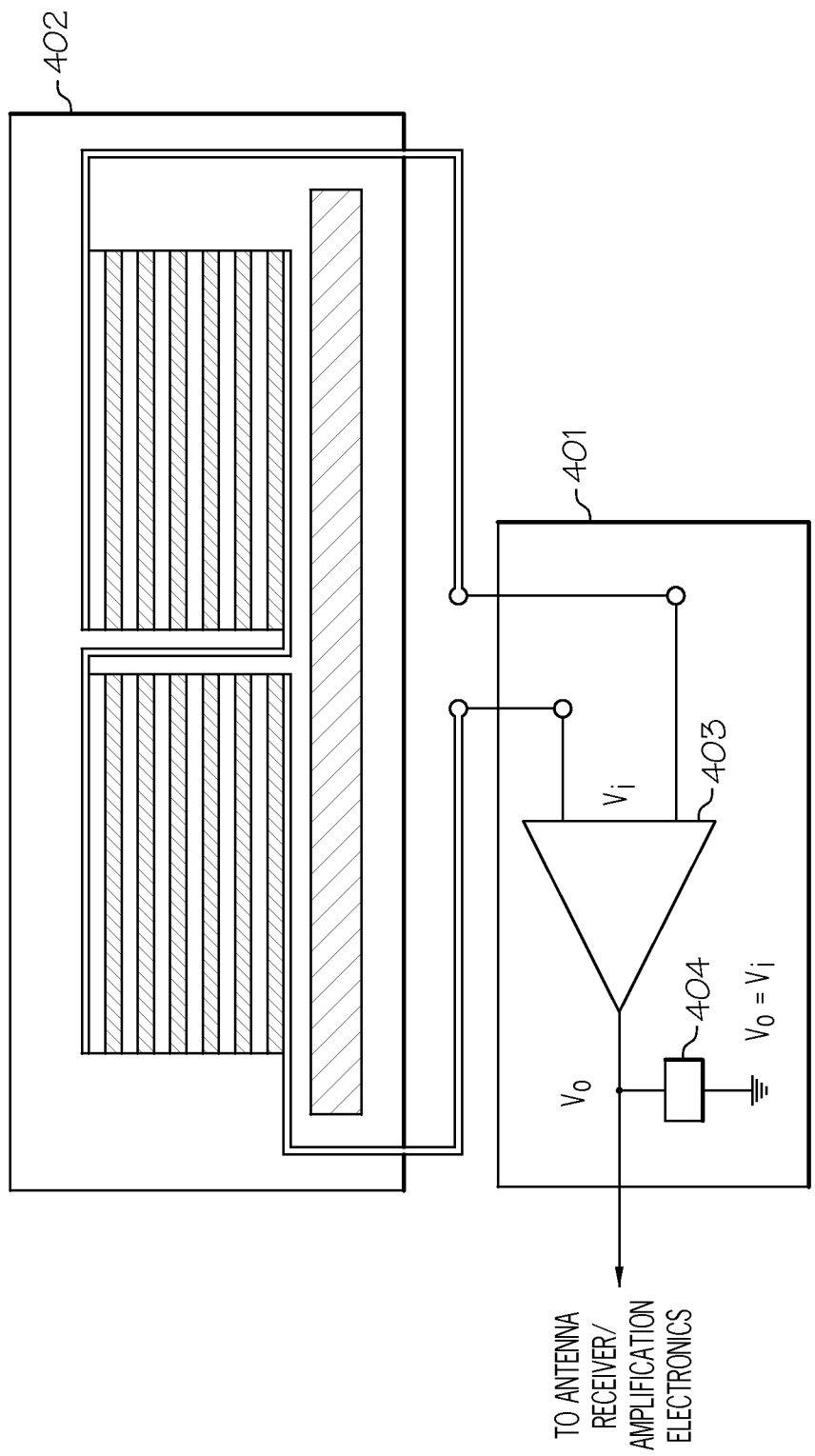
FIG. 4 is a diagram of an impedance matching circuit according to an exemplary embodiment of the present disclosure.

FIG. 4 shows a diagram of an impedance matching circuit according to an exemplary embodiment of the present disclosure. An impedance matching circuit 401 may be interconnected to the multiferroic sensor 402 and receive a voltage Vi from the multiferroic sensor 402. In this exemplary embodiment, the impedance matching circuit 401 includes an op amp 403 that receives the multiferroic sensor output voltage Vi and generates an output voltage Vo where Vo=Vi. A receiver load 404 may be connected between the output of the op amp 403 and an electrical ground and may have a typical impedance matching resistance such as, for example, 50 ohm. The output from the op amp 403, Vo, may also be the output from the impedance matching circuit 401 and may be connected to antenna receiver/amplification electronics. The impedance matching circuit 401 matches an impedance of the multiferroic sensor 402 with the antenna receiver/amplification electronics. Although an op amp is shown in the impedance matching circuit 401, any other type of efficient coupling and impedance matching type circuitry may also be used and be within the scope of the present disclosure.

Figure 5:
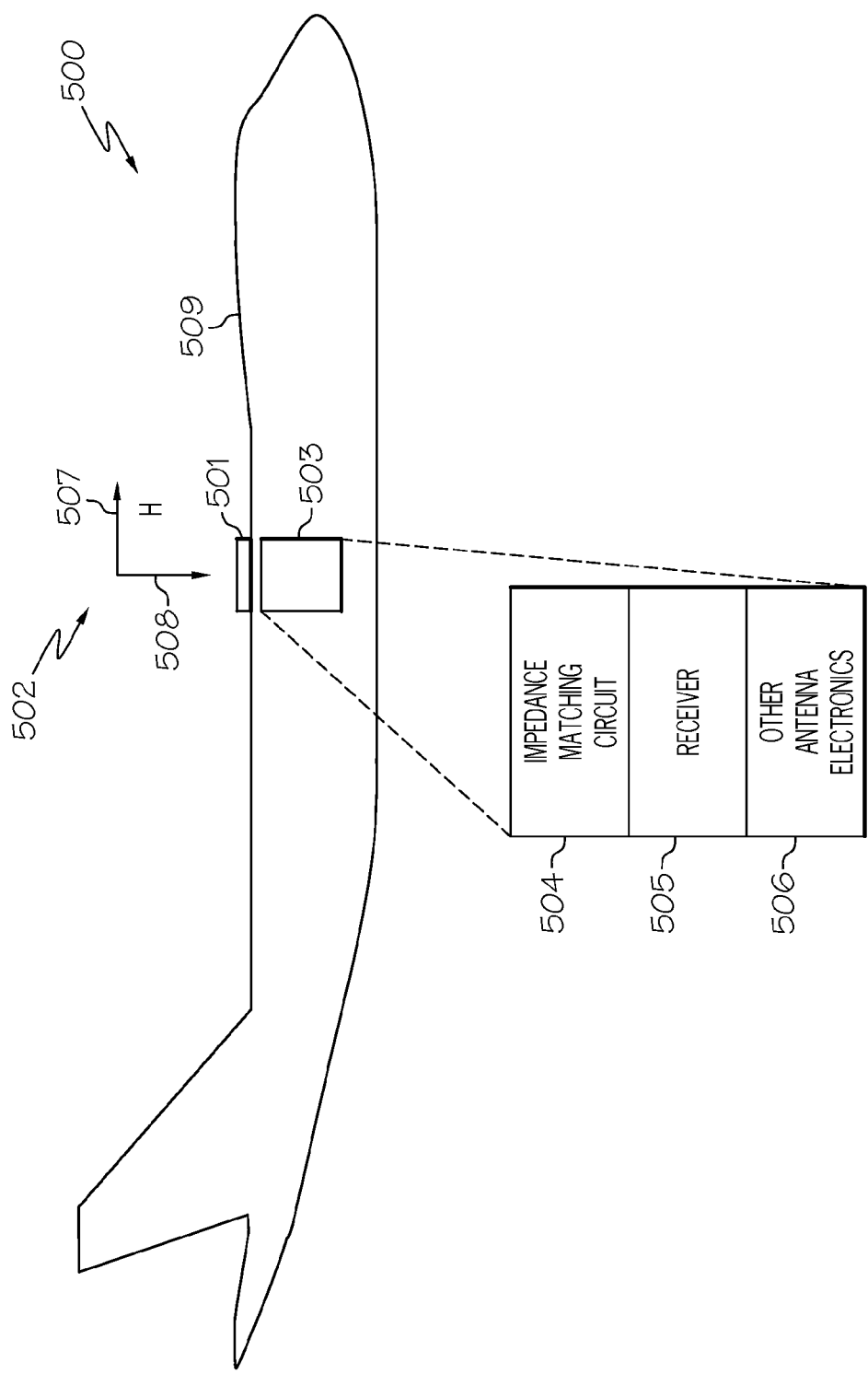
FIG. 5 is a diagram of an aircraft with a multiferroic antenna according to an exemplary embodiment of the present disclosure.

FIG. 5 shows a diagram of an aircraft with a multiferroic antenna according to an exemplary embodiment of the present disclosure. The aircraft 500 may include a multiferroic antenna that includes a multiferroic sensor 501 residing on the outside of a skin 509 of the aircraft 500. The multiferroic sensor 501 may be connected to additional antenna electronics 503 that reside interior to the aircraft 500. The antenna electronics 503 may include an impedance matching circuit 504, receiver electronics 505 and other typical antenna electronics 506. The sensor 501 and electronics 503 may be fabricated in thin layers. An incident wave 502 may include an electrical field (not shown) that is perpendicular to a direction of a magnetic field 507. The incident signal 502 may be moving in a direction 508 or any other direction. The magnetic field 507 of the incident wave 508 may cause multiferroic stacks of multiple connected multiferroic layered-pairs that include alternating layers of magnetostrictive material and piezoelectric material bonded together to produce an output electrical voltage that is transmitted to the receiver 505 from the multiferroic sensor 501 via the impedance matching circuit 504.

Figure 6:
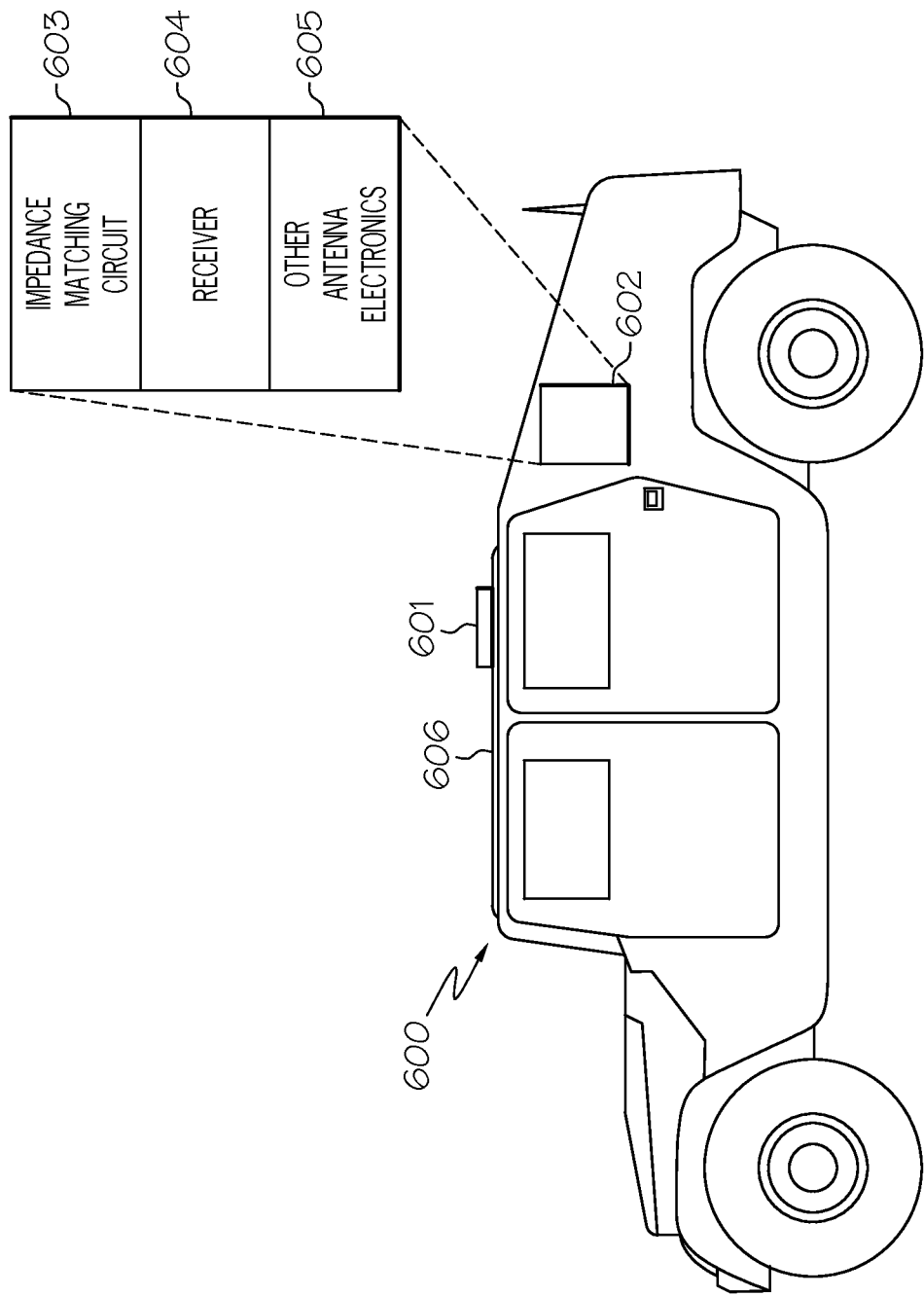
FIG. 6 is a diagram of a vehicle with a multiferroic antenna according to an exemplary embodiment of the present disclosure.

FIG. 6 shows a diagram of a vehicle with a multiferroic antenna according to an exemplary embodiment of the present disclosure. The vehicle 600 in this exemplary embodiment may be an automobile and may have a multiferroic antenna installed. The multiferroic antenna may include a multiferroic sensor 601 and additional antenna electronics 602. The sensor 601 and electronics 602 may be fabricated in thin layers. The additional antenna electronics 602 may include an impedance matching circuit 603, receiver electronics 604 and other antenna electronics 605. The multiferroic sensor 601 may be attached to an outer surface 606 of the vehicle for receiving the magnetic field of an incident signal. The additional antenna electronics 602 may reside interior to the vehicle 600.

Multiferroic sensor embodiments according to the present disclosure provide varied broadband sensitivity to RF signals without the use of cryogenics or DC bias currents. This is beneficial for high frequency (HF) and very high frequency (VHF) bands. In contrast to conventional antennas that must be on the order of a half-wavelength to achieve good performance, multiferroic sensor arrays according to embodiments of the present disclosure have an essentially frequency-independent response. For example, a 1 mm×1 mm multiferroic stack terminated in a FET may be calculated to have a gain of −65 dBi at 100 MHz. Combining 1000 such elements in a square array of roughly 1.5"×1.5" yields a gain of −35 dBi assuming the powers are summed, and −5 dBi if the voltages are summed. FET based impedance transformers offer very wide band interfaces between the multiferroic sensor array and the RF receiver electronics. The input impedance to the FET may be very high (e.g., megaohm) due to the fact that its impedance may be only a femto farad level gate capacitance. This high input impedance enables 1000 multiferrroic arrays to become practical over wide bandwidths (e.g., DC to GHz frequencies). The result may be up to −5 dBi gain at 100 MHz in a 1.5"×1.5" square multiferroic sensor array.

Moreover, embodiments according to the present disclosure provide superior linearity providing a high dynamic range and prevents distortion of the received incident signal. The ability of an antenna/sensor according to the present disclosure to function without the need for cooling provides a weight and cost savings. Further, the removal of the requirement for a DC bias current provides a significant savings in operating power of the device.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

What is claimed is:

1. A multiferroic sensor comprising:
an array comprising more than four multiferroic stacks configured as an antenna to receive an incident signal, the more than four multiferroic stacks being connected at least one of in series or in parallel, wherein each multiferroic stack comprises a multiferroic stack of multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal,
wherein an output of the multiferroic stack comprises the electrical voltage amplified proportional to a total number of multiple connected multiferroic layer-pairs in the multiferroic stack; and
wherein when the more than four multiferroic stacks are connected in series an amount of voltage delivered by the array is proportional to a number of the more than four multiferroic stacks connected in series, and wherein when the more than four multiferroic stacks are connected in parallel an amount of current delivered by the array is proportional to a number of the multiferroic stacks connected in parallel.

2. The sensor according to claim 1, wherein a length and width of the multiferroic stack are a size allowing the incident signal's magnetic field to penetrate an interior of the multiferroic stack from the sides, wherein the incident signal is incident from above the array.

3. The sensor according to claim 1, wherein a length and width of the multiferroic stack are a size causing a mechanical resonance that is at least one of higher than an intended operating frequency of the antenna or at the intended operating frequency of the antenna.

4. The sensor according to claim 1, wherein the more than four multiferroic stacks in the array are separate by gaps and mounted on a ground plane.

5. The sensor according to claim 1, wherein the magnetostrictive material comprises one of Terfenol or nickel.

6. The sensor according to claim 1, wherein the magnetostrictive material is one of magnetically biased or not magnetically biased.

7. The sensor according to claim 1, wherein the magnetostrictive material is less than one electrical skin depth.

8. The sensor according to claim 1, wherein the piezoelectric material layers are polarized in a direction perpendicular to a ground plane of the antenna/sensor.

9. The sensor according to claim 1, wherein the piezoelectric material comprises one of zirconium titrate (PZT) or lead-magnesium-niobium-Ti-0 (PMN-PT).

10. The sensor according to claim 1, further comprising a thickness ratio of the magnetostrictive material layers to the piezoelectric material layers being related to a relative mechanical modulii of the layers.

11. The sensor according to claim 10, wherein a thickness ratio of the magnetostrictive material layers to the piezoelectric material layers comprises ½.

12. The multiferroic sensor of claim 1, wherein the more than four multiferroic stacks are connected in series by each multiferroic stack comprising a first layer of interconnect material connected to a top layer of the multiferroic stack and a second layer of interconnect material connected to a bottom layer of the multiferroic stack, the first layer of interconnect material being connected to the second layer of interconnect material of an adjacent multiferroic stack and the second layer of interconnect material of a first multiferroic stack of the series connected multiferroic stacks is connected to a first sensor output and the first layer of interconnect material of a last multiferroic stack of the series connected multiferroic stacks is connected to a second sensor output.

13. An aircraft comprising:
a skin; and
an antenna including a multiferroic sensor, the multiferroic sensor comprising an array including more than four multiferroic stacks configured to form the antenna to receive an incident signal, the more four multiferroic stacks being connected at least one of in series or in a parallel, each multiferroric stack residing on an outside of the skin, each multiferroic stack comprising multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal,
wherein an output of the multiferroic sensor comprises the electrical voltage amplified proportional to a total number of multiple connected multiferroic layer-pairs in the multiferroic stack; and
wherein when the more than four multiferroic stacks are connected in series an amount of voltage delivered by the array is proportional to a number of the more than four multiferroic stacks connected in series, and wherein when the more than four multiferroic stacks are connected in parallel an amount of current delivered by the array is proportional to a number of the more than four multiferroic stacks connected in parallel.

14. The aircraft according to claim 13, wherein the antenna further comprises a receiver, the receiver amplifying and processing the multiferroic sensor output.

15. The aircraft according to claim 13, wherein the antenna further comprises a matching circuit connected between the multiferroic sensor and the receiver, the matching circuit matching an impedance of the multiferroic sensor to an impedance of the receiver, wherein the matching circuit comprises:
an amplifier connected to an output of the antenna; and a receiver loaded connected between an output of the amplifier and an electrical ground.

16. The aircraft according to claim 13, wherein a length and width of the multiferroic stack are a size allowing the incident signal's magnetic field to penetrate an interior of the multiferroic stack from the sides.

17. The aircraft according to claim 13, wherein a length and width of the multiferroic stack are a size causing a mechanical resonance that is at least one of higher than an intended antenna operating frequency of the antenna or at the intended antenna operating frequency of the antenna.

18. The aircraft according to claim 13, wherein the more than four multiferroic stacks in the array are separated by gaps and mounted on a ground plane. stacks in the array are separated by gaps and mounted on a ground plane.

19. An antenna comrprising:
a multiferroic sensor, the multiferroic sensor comprising an array including more than four multiferroic stacks configured to form the atenna to received an incident signal, the more than four multiferroic stacks being connected at least one of in series or parallel, each multiferroric stack residing on an outside of the skin, the multiferroic stack comprising multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal, an output of the multiferroic sensor comprising the electrical voltage amplified proportional to a total number of multiple connected multiferroic layer-pairs in the multiferroic stack, wherein when the more than four multiferroic stacks are connected in series an amount of voltage delivered by the array is proportional to a number of the more than four multiferroic stacks connected in series, and wherein when the more than four multiferroic stacks are connected in parallel an amount of current delivered by the array is proportional to a number of the more than four multiferroic stacks connected in parallel;

a receiver, the receiver amplifying and processing the multiferroic sensor output; and a matching circuit connected between the multiferroic sensor and the receiver, the matching circuit matching an impedance of the multiferroic sensor to an impedance of the receiver.

* * * * *